United States Patent [19]

Kawamoto et al.

[11] Patent Number: 5,151,806
[45] Date of Patent: Sep. 29, 1992

[54] LIQUID CRYSTAL DISPLAY APPARATUS HAVING A SERIES COMBINATION OF THE STORAGE CAPACITORS

[75] Inventors: Satoru Kawamoto; Noaki Nakagawa; Masahiro Hayama, all of Amagasaki, Japan

[73] Assignee: Mitsubishi Denki Kabushiki Kaisha, Tokyo, Japan

[21] Appl. No.: 665,591

[22] Filed: Mar. 6, 1991

[30] Foreign Application Priority Data

Apr. 27, 1990 [JP] Japan .................................. 2-114301

[51] Int. Cl.⁵ .............................................. G02F 1/13
[52] U.S. Cl. .................................... 359/59; 359/87; 340/784
[58] Field of Search .................... 359/54, 58, 59, 79, 359/87; 340/784, 719

[56] References Cited

U.S. PATENT DOCUMENTS

| | | | |
|---|---|---|---|
| 4,704,559 | 11/1987 | Suginoya et al. | 315/169.1 |
| 4,928,095 | 5/1990 | Kawahara | 340/784 |
| 5,042,916 | 8/1991 | Ukai et al. | 359/59 |

FOREIGN PATENT DOCUMENTS

| | | | |
|---|---|---|---|
| 0119322 | 7/1984 | Japan | 340/784 |
| 0273838 | 11/1988 | Japan | 340/784 |
| 64-26822 | 1/1989 | Japan | |
| 0169431 | 7/1989 | Japan | 340/784 |
| 0251016 | 10/1989 | Japan | 340/784 |
| 0051129 | 2/1990 | Japan | 340/784 |

OTHER PUBLICATIONS

I. Kobayashi et al, "Rear-Projection TV Using High-Resolution a-Si TFT-LCD" *1989 Sid International Symposium Digest of Technical Papers.*

Y. Asai et al, "A 6.7-in. Square High-Resolution Full-Color TFT-LCD", *Proceeding of 9th. International Display Research Conference,* Japan Display, 1989.

T. P. Brody et al, "A 6×6 Inch 20 Lines-per-Inch Liquid-Crystal Display Panel", *IEEE Transaction on Electron Device,* 1989.

*Primary Examiner*—Stanley D. Miller
*Assistant Examiner*—Huy K. Mai
*Attorney, Agent, or Firm*—Burns, Doane, Swecker & Mathis

[57] ABSTRACT

An active matrix-type liquid crystal display apparatus, in which a pixel electrode and a common electrode line are not overlapped but coupled capacitively by a floating electrode, so that the pixel electrode and common electrode do not short-circuit, and a storage capacitance is formed by the series connection of a plurality of capacitors. An active matrix-type liquid crystal display apparatus, in which a pixel electrode and a gate electrode line at the succeeding or preceeding row are not overlapped but coupled capacitively by a floating electrode, so that the pixel electrode and gate electrode do not short-circuit, and a storage capacitance is formed by the series connection of a plurality of capacitors.

3 Claims, 38 Drawing Sheets

LIQUID CRYSTAL DISPLAY APPARATUS
HAVING A SERIES COMBINATION OF THE
STORAGE CAPACITORS

BACKGROUND OF THE INVENTION

1. Field of the Invention

This invention relates to a liquid crystal display apparatus using a TFT (thin film transistor) array substrate, and more particularly, to a liquid crystal display apparatus designed, with an aim to improve the apparatus in quality by reducing short-circuit of a storage capacitance provided in a TFT array substrate.

2. Description of Related Art

In a general liquid crystal display apparatus, an image is indicated when a voltage is applied the material for display such as liquid crystal held between two confronting substrates. Pixel electrodes are arranged in matrix at least on one of the substrates of the liquid crystal display apparatus to selectively drive the pixels by respective active elements, for example, field effect transistors (FET's) having nonlinear characteristic. Moreover, a storage capacitance is provided for each pixel to improve the image quality.

FIG. 1 is a plan view showing the structure of a TFT array substrate of one pixel used in a conventional liquid crystal display apparatus disclosed, e.g., in "Proceeding of 9 the INTERNATIONAL DISPLAY RESEARCH CONFERENCE (Japan Display '89, pp. 514–517, 1989). FIG. 2 is a cross section taken along the line A—A' of FIG. 1, and FIG. 3 is a diagram of an equivalent circuit of FIG. 1.

Referring to these drawings, numeral 1 represents a source electrode line, 2 a gate electrode line, 3 a common electrode line, 4 a gate insulating film, 5 an amorphous silicon (i) layer, 7 an amorphous silicon (n+) layer, 8 a drain electrode, 9 a pixel electrode, 10 a protecting film, 14 a transparent insulating substrate, 18 a storage capacitance, 35 a liquid crystal and 38 a counter electrode, respectively.

It will be described now how to manufacture the conventional liquid crystal display apparatus having the above-mentioned structure.

The gate electrode line 2 and common electrode line 3 of MoTa are formed on the transparent insulating substrate 14. Then, each surface of the gate electrode line 2 and common electrode line 3 is subjected to anodic oxidation. The gate insulating film 4, amorphous silicon (i) layer 5 and amorphous silicon (n+) layer 7 are successively formed and patterned thereon, and the pixel electrode 9 is formed. Thereafter, the source electrode line 1 and drain electrode 8 are formed, thereby constituting a TFT. A TFT array is composed of the TFT's and pixel electrodes 9. When the common electrode 3 and pixel electrode 9 are overlapped each other across the gate insulating film 4, the storage capacitance 18 is formed. The liquid crystal 35 is held between the TFT array substrate formed in the aforementioned manner and counter electrode substrate 38 having a color filter and a transparent conductive film, whereby the liquid crystal display apparatus is manufactured.

Since the conventional liquid crystal display apparatus has the above-described structure wherein the common electrode line 3 and pixel electrode 9 are overlapped, the production yield lowers because a storage capacitor is broken to result in short-circuit of the common electrode line 3 and drain electrode 8.

FIG. 4 illustrates a plan view showing the structure of another TFT array substrate of one pixel used in a conventional liquid crystal apparatus disclosed in, for example, Japanese Patent Application Laid-Open No. 64-26822 (1989). FIG. 5 is a cross sectional view taken along the line B—B' of FIG. 4 and FIG. 6 is a diagram of an equivalent circuit of FIG. 4. In FIGS. 4 through 6, numerals 19 and 24 represent Al a gate wiring pattern by Al and a gate electrode line at the succeeding row, respectively. Numerals 1, 2, 4, 5, 7, 8, 9, 10, 14, 18, 35 and 36 represent the same elements as in FIGS. 1 through 3.

The liquid crystal display apparatus shown in FIGS. 4–6 is manufactured in the following manner.

In the first place, the gate electrode lines 2 and 24 of Cr are formed on the transparent insulating substrate 14. Further, the gate wiring pattern 19 of Al is formed on the gate electrode line 24. Then, a TFT is formed by the gate insulating film 4, semiconductor film 5, source electrode line 1 and drain electrode 8. The TFT's constitute a TFT array along with the pixel electrodes 9. Since the gate electrode line 24 at the succeeding row has a constant potential except when it is scanned, when it is overlapped with the pixel electrode 9 across the gate insulating film 4, the storage capacitance 18 is formed. The liquid crystal 35 is sandwiched between the TFT array substrate obtained as above and counter electrode 38 having a color filter and a transparent conductive film. Thus, the liquid crystal display apparatus of FIGS. 4 through 6 is obtained.

In the conventional liquid crystal display apparatus of the above-described structure, since the gate electrode line 24 at the succeeding row serves as an electrode for the storage capacitance, the storage capacitance is broken to cause short-circuit between the gate electrode line 24 and drain electrode 8, which results in lowering the production yield.

SUMMARY OF THE INVENTION

Accordingly, this invention has been devised to solve the above-described disadvantages.

A first object of this invention is to provide a liquid crystal display apparatus with high production yield which prevents short-circuit between a common electrode and a pixel electrode by capacitively coupling both the electrodes through a floating electrode without directly overlapping the same.

A second object of this invention is to provide a liquid crystal display apparatus with high production yield which prevents short-circuit between a gate electrode at a succeeding or preceding row and a pixel electrode by capacitively coupling both the electrodes through a floating electrode without directly overlapping the same.

A third object of this invention is to provide a liquid crystal display apparatus allowing a storage capacitance to be effective by forming the storage capacitance with a plurality of capacitors coupled in series even when one capacitor is short-circuited.

The above and further objects and features of the invention will more fully be apparent from the following detailed description with accompanying drawings.

DESCRIPTION OF THE PREFERRED EMBODIMENTS

A liquid crystal display apparatus according to one preferred embodiment of this invention will be fully discussed hereinafter with reference to the accompanying drawings.

Figure 1:
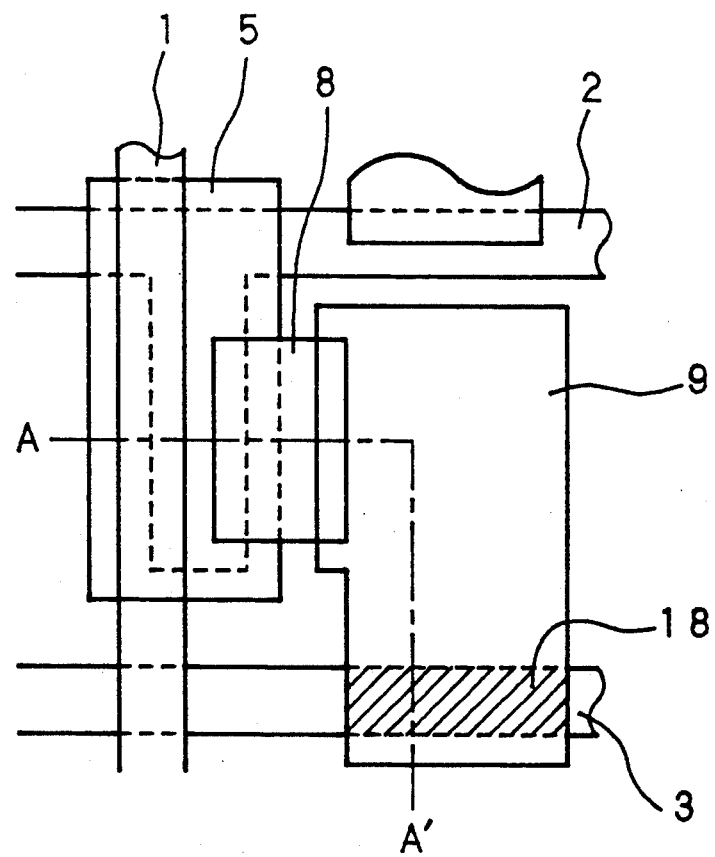
FIG. 1 is a plan view showing the structure of a TFT array substrate of one pixel used in a conventional liquid crystal display apparatus.
Figure 2:
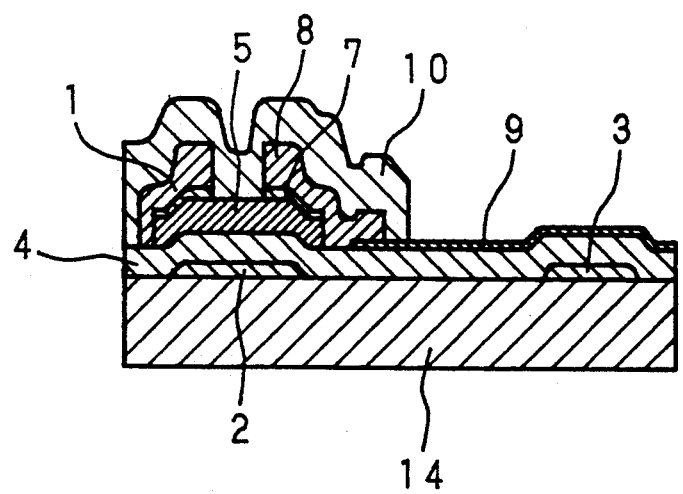
FIG. 2 is a cross sectional view taken along the line A—A' of FIG. 1.
Figure 3:
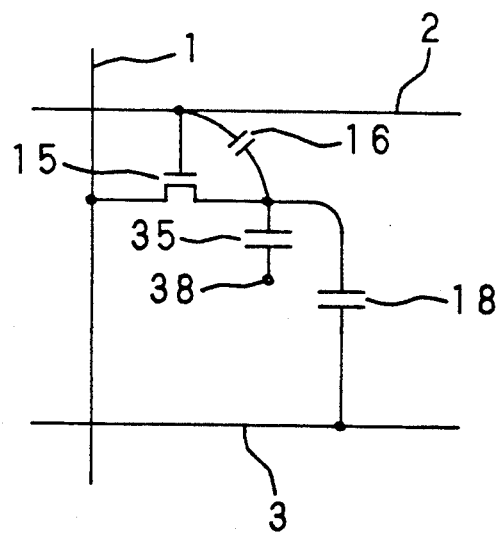
FIG. 3 is a diagram of an equivalent circuit of FIG. 1.
Figure 4:
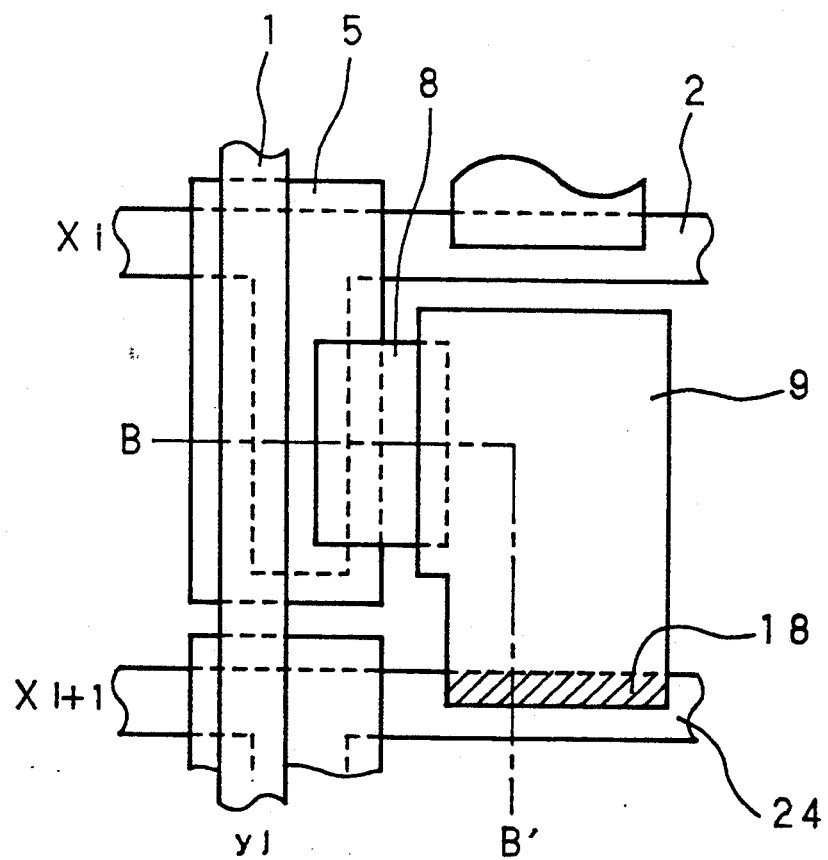
FIG. 4 is a plan view showing the structure of another TFT array substrate of one pixel used in a conventional liquid crystal display apparatus.
Figure 5:
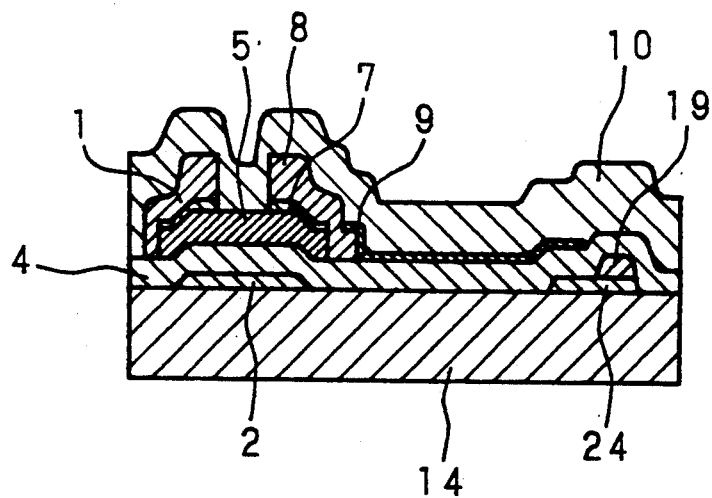
FIG. 5 is a cross sectional view taken along the line B—B' of FIG. 4.
Figure 6:
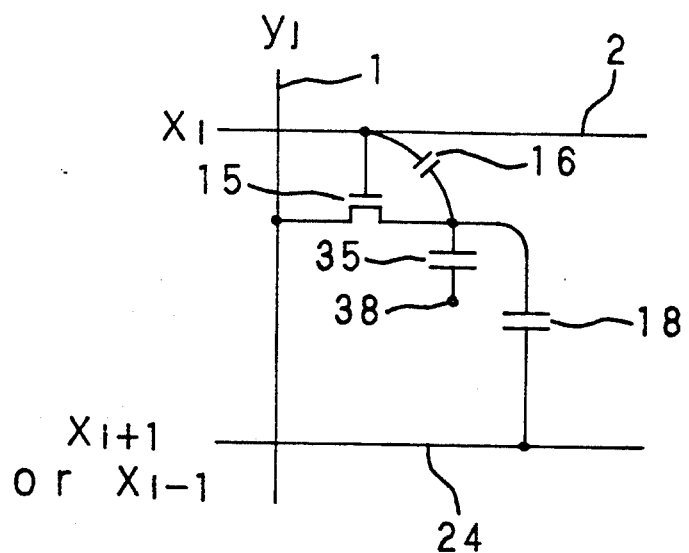
FIG. 6 is a diagram of an equivalent circuit of FIG. 4.
Figure 7:
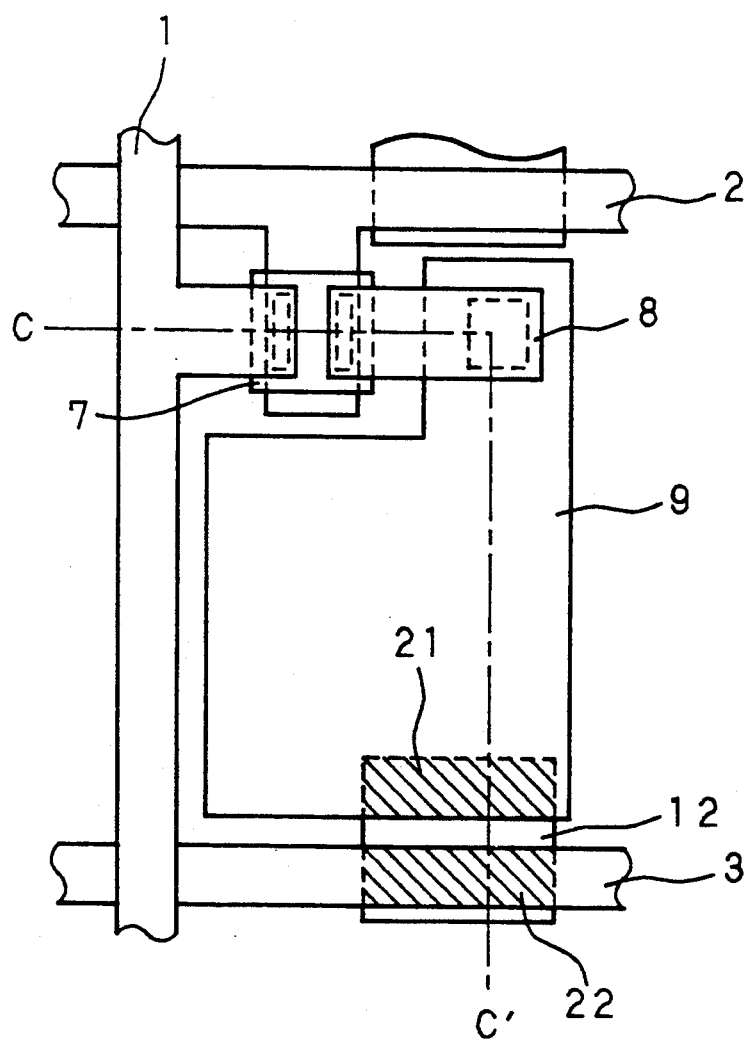
FIG. 7 is a plan view showing the structure of a TFT array of one pixel used in a liquid crystal display apparatus according to one embodiment of this invention.
Figure 8:
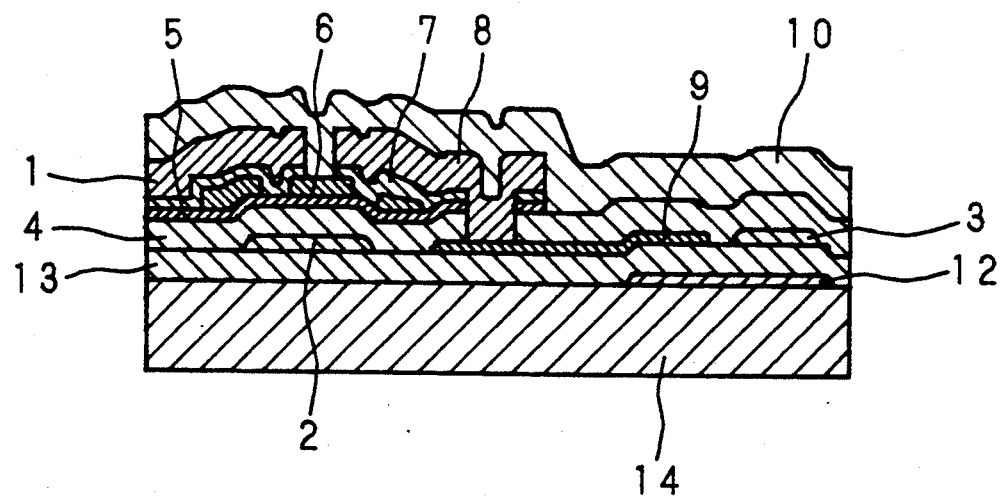
FIG. 8 is a cross sectional view taken along the line C—C' of FIG. 7.
Figure 9:
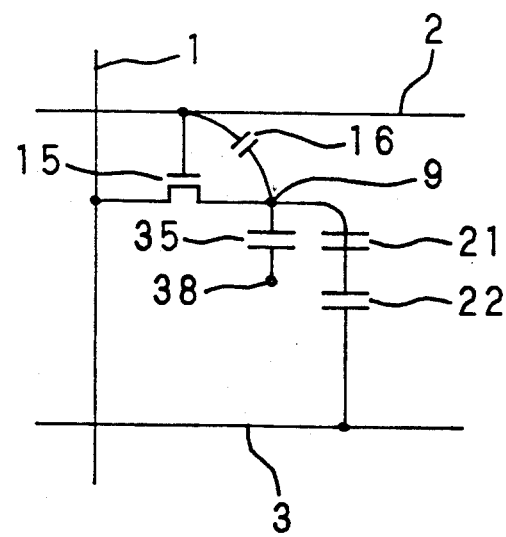
FIG. 9 is a diagram of an equivalent circuit of FIG. 7.

FIGS. 7 through 9 are respectively a plan view showing the structure of a TFT array substrate of one pixel used in a liquid crystal display apparatus according to one preferred embodiment of this invention, a cross sectional view taken along the line C—C' of FIG. 7 and a circuit diagram of FIG. 7. In FIGS. 7 through 9, numeral 1 indicates a source electrode and source electrode line, 2 a gate electrode line, 3 a common electrode line, 4 a gate insulating film, 5 a semiconductor (i) layer, 6 an upper insulating film, 7 a semiconductor (n+) layer, 8 a drain electrode, 9 a pixel electrode, 10 a protecting film, 12 a floating electrode, 13 a dielectric film, 14 a transparent insulating substrate, 15 a TFT, 16 a parasitic capacitance between a gate and drain, 21 a first storage capacitance and 22 a second storage capacitance.

The above-mentioned TFT array substrate is manufactured in the following manner.

A transparent conductive film of ITO or the like is formed on the transparent insulating substrate 14 made of glass through EB deposition. Then, an unnecessary portion of the transparent conductive film is removed through photolithography and etching, on which the island-like floating electrode 12 is formed. Thereafter, the dielectric film 13 is formed by one or plural layers of silicon nitride, silicon oxide or tantalum oxide through plasma CVD or sputtering, etc.

After a transparent conductive thin film of ITO is formed through sputtering etc., the pixel electrode 9 is formed through photolithography and ethcing etc. At this time, the floating electrode 12 is overlapped with the pixel electrode 9 across the dielectric film 13 held therebetween, thus constituting the first storage capacitance 21.

Subsequently, such metal as Cr or Mo is deposited by sputtering or the like method. The gate electrode line 2 and common electrode line 3 are formed through photolithography and etching etc. At this time, the floating electrode 12 is overlapped with the common electrode line 3 across the dielectric film 13 held therebetween, so that the second storage capacitance 22 is formed. Then, the gate insulating film 4 of silicon nitride or the like, semiconductor (i) layer 5, e.g., amorphous silicon (i) layer and upper insulating film 6 are successively deposited by plasma CVD, etc. Thereafter, the upper insulating film 6 is patterned. After the amorphous silicon (n+) layer 7 is formed through plasma CVD or the like, a contact hole between the pixel electrode 9 and drain electrode 10 is formed through patterning. A conductive thin film of Al, Mo or the like is deposited by sputtering etc., and the source electrode line 1 and drain electrode 8 are patterned. Furthermore, the unnecessary portions of the semiconductor (n+) layer 7 and semiconductor (i) layer 5 are removed through dry etching. Finally, in order to obtain the protecting film 10, a film of silicon nitride or silicon oxide, etc. is deposited by plasma CVD and patterned.

The liquid crystal display apparatus is hence manufactured by interposing the display material such as liquid crystal between the TFT array substate obtained in the above-described manner and the counter electrode substrate having a transparent electrode, a color filter, etc.

According to this embodiment, the pixel electrode 9 is arranged not to overlap with the common electrode 3, and moreover, the floating electrode 12 extends to both the pixel electrode 9 and common electrode 3. Accordingly, the pixel electrode 9 and common electrode 3 are capacitively coupled with each other by means of the series-connection of the capacitance between the floating electrode 12 and pixel electrode 9, and that between the floating electrode 12 and common electrode 3. Even when the short-circuit between the floating electrode 12 either the pixel electrode 9 or the common electrode 3, occurs, the short-circuit between the common electrode 3 and drain electrode 8 never occurs. Therefore, the lowering in production yield resulting from the short-circuit can be diminished.

Although the floating electrode 12 in this embodiment is a transparent conductive film, an opaque conductive film, a metallic film or the like may be employed if it is not inconvenient for display.

Figure 10:
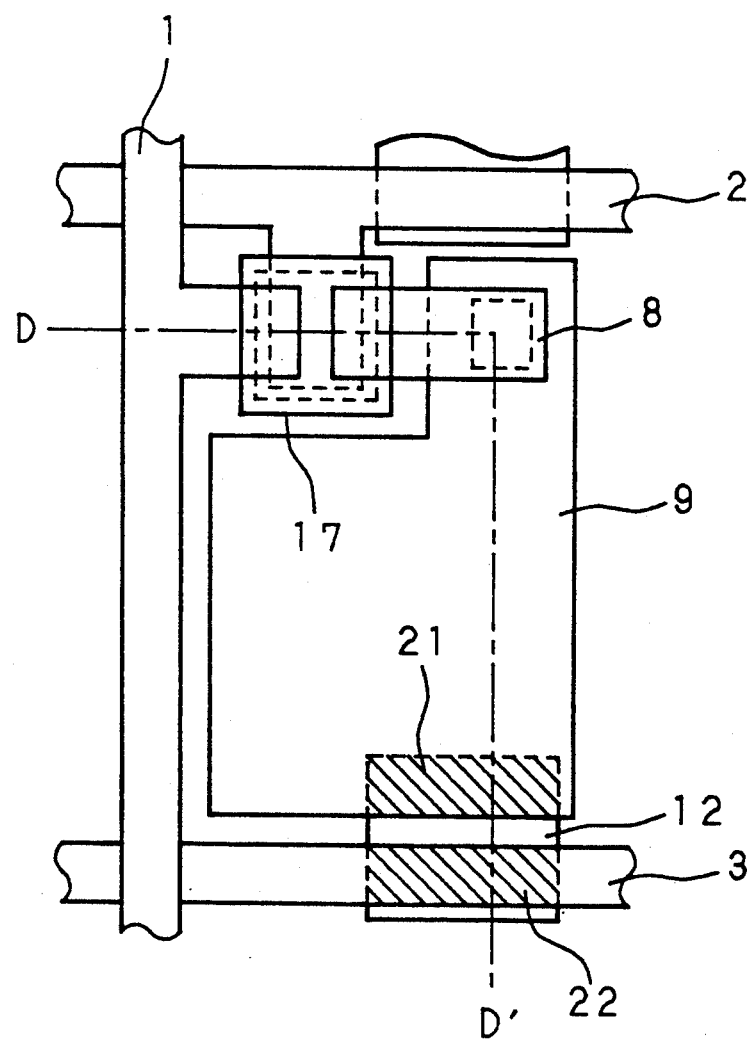
FIG. 10 is a plan view showing a modified structure of a TFT array substrate of one pixel used in the liquid crystal display apparatus according to this invention.
Figure 11:
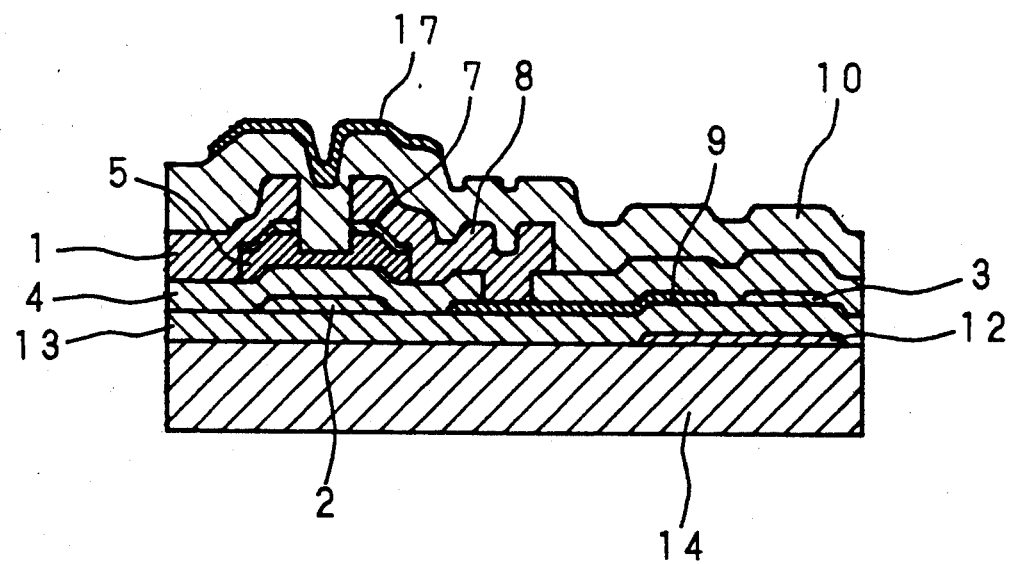
FIG. 11 is a cross sectional view taken along the line D—D' of FIG. 10.
Figure 12:
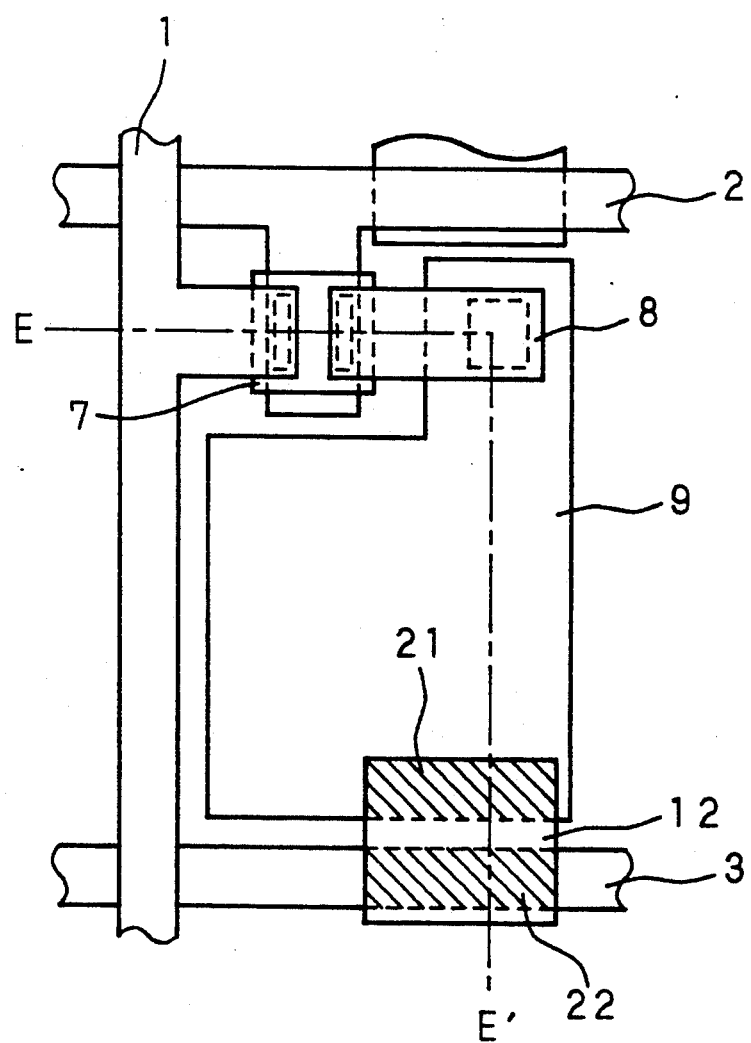
FIG. 12 is a plan view showing a modified structure of a TFT array substrate used in the liquid crystal display apparatus according to this invention.
Figure 13:
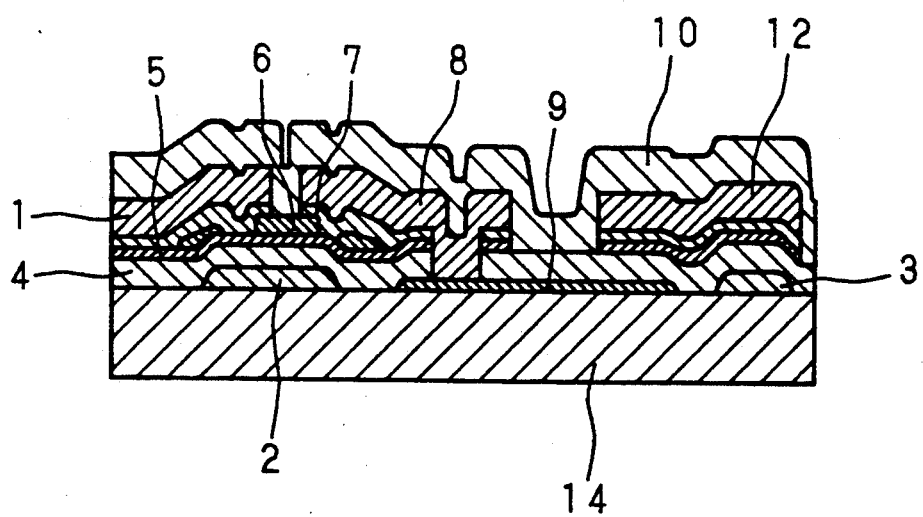
FIG. 13 is a cross sectional view taken along the line E—E' of FIG. 10.
Figure 14:
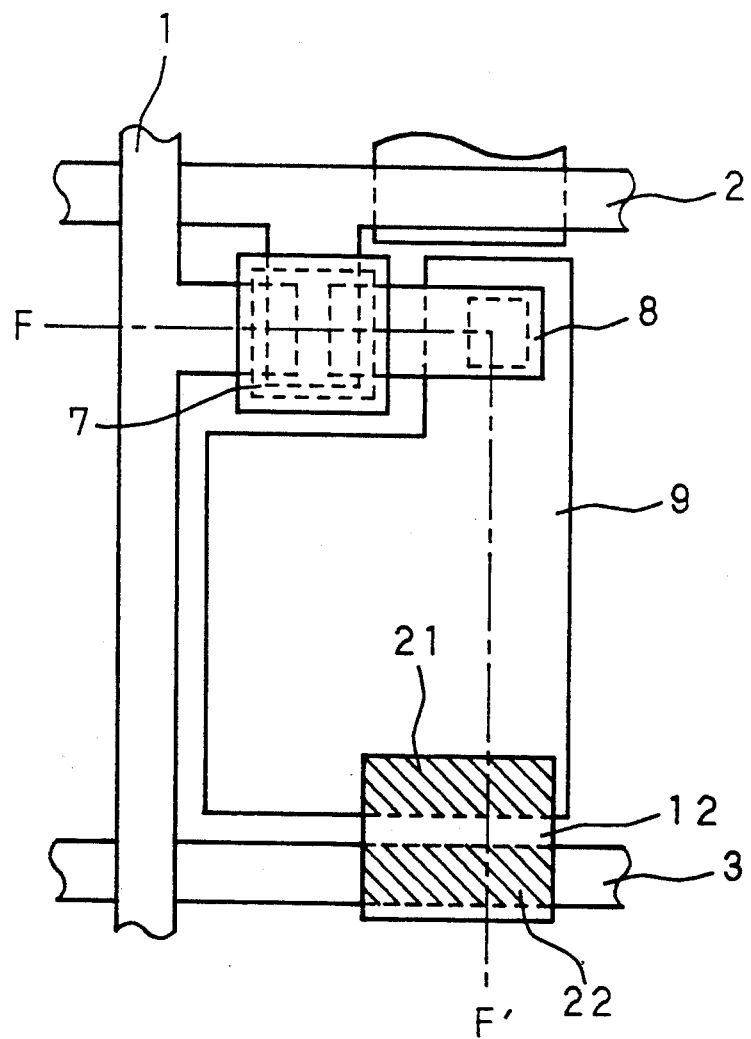
FIG. 14 is a plan view showing a modified structure of a TFT array substrate of one pixel used in the liquid crystal display apparatus according to this invention.
Figure 15:
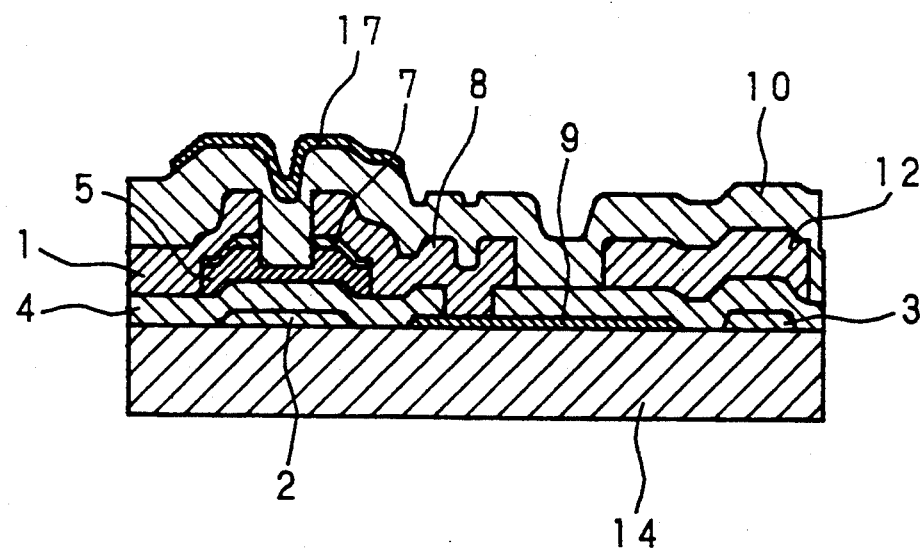
FIG. 15 is a cross sectional view taken along the line F—F' of FIG. 14.

Moreover, although the upper insulating film 6 is provided on of the TFT array substrate in this embodiment, it may be possible not to use the upper insulating film as indicated in a modification of FIGS. 10 and 11.

Though the floating electrode 12 and dielectric film 13 in the above-discussed embodiment are formed first to obtain the first and second storage capacitances 21 and 22, the floating electrode 12 may be formed by using the material of the source and drain electrodes 1 and 8, and the first and second storage capacitances 21 and 22 may be formed between the pixel electrode 9 and the floating electrode 12, and between the floating electrode 12 and the common electrode line 3, across the gate insulating film 4, as shown in FIGS. 12 and 13, or FIGS. 14 and 15. It may also be possible to provide the floating electrodes of the above two types for respective capacitances 21 and 22.

Figure 16:
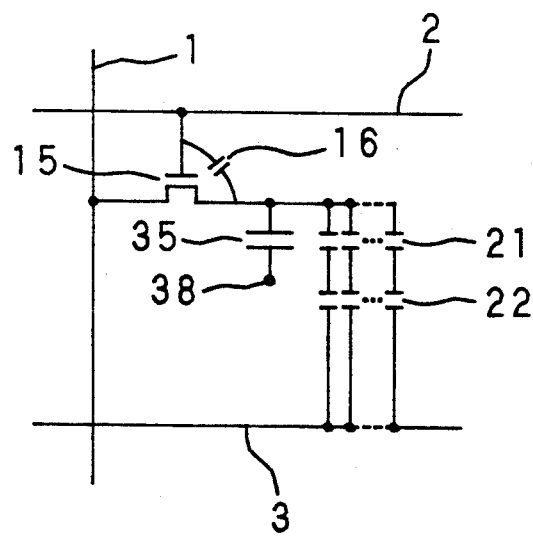
FIG. 16 is a diagram of an equivalent circuit of FIG. 14.
Figure 17:
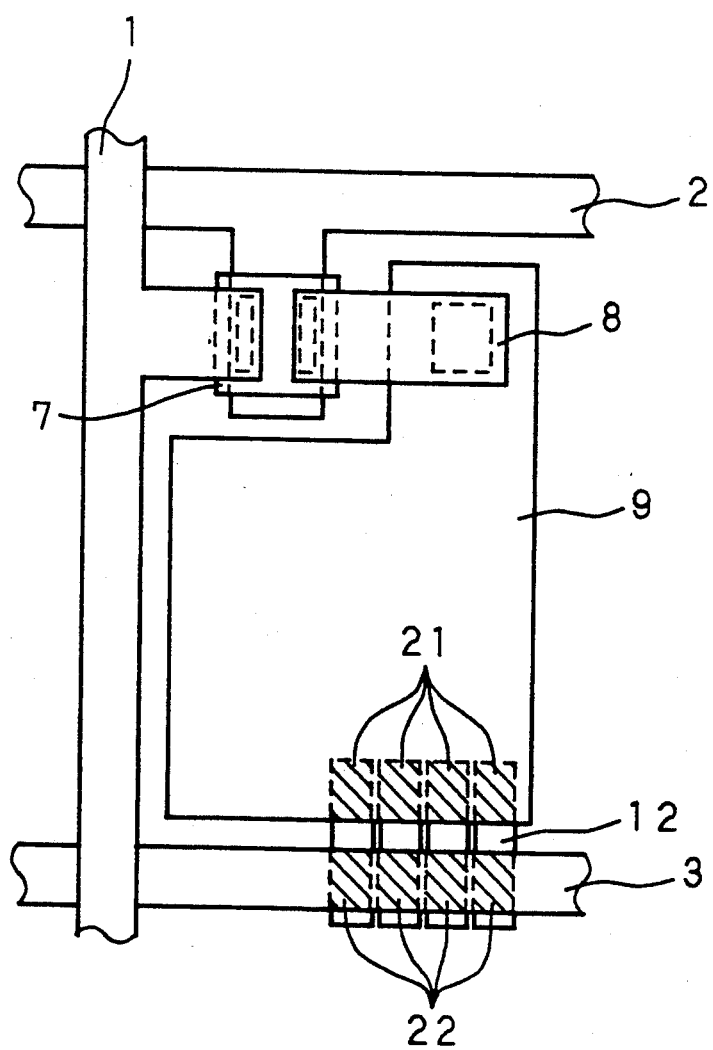
FIG. 17 is a plan view showing a modified structure of a TFT array substrate of one pixel used in the liquid crystal display apparatus according to this invention.

Although the TFT array substrate in the above embodiment has one floating electrode 12, a plurality of floating electrodes may be used as shown in FIG. 16. FIG. 17 shows the structure of an example of the TFT array substrate with four floating electrodes 12.

Figure 18:
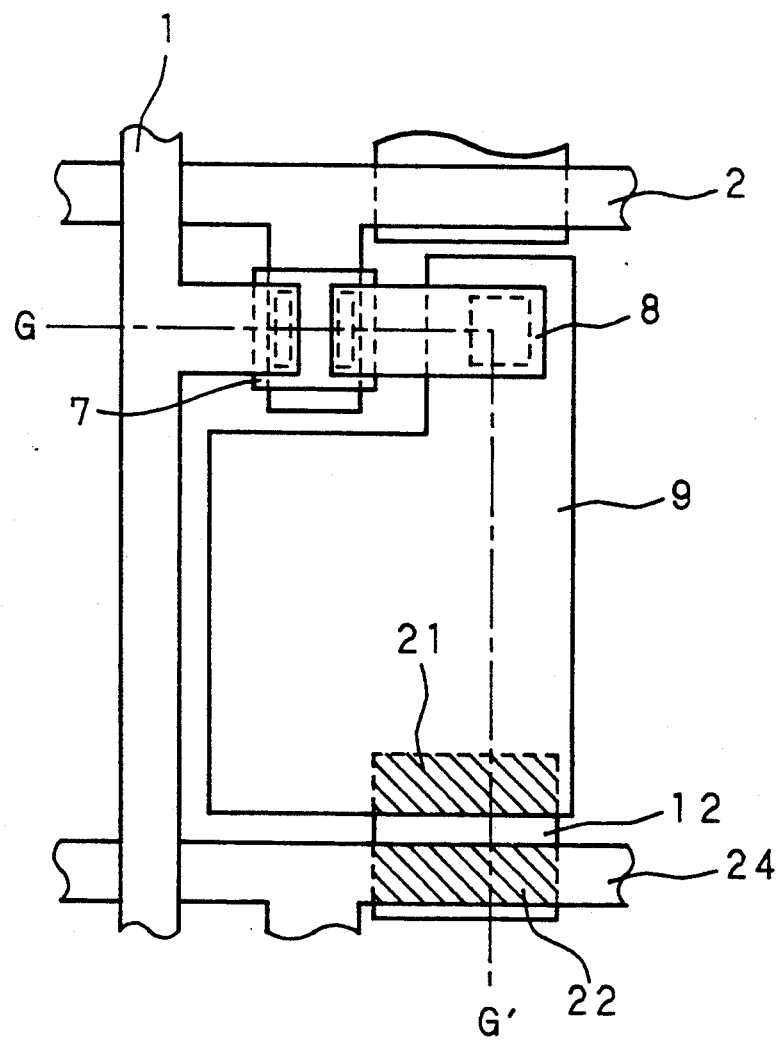
FIG. 18 is a plan view showing a modified structure of a TFT array substrate of one pixel used in the liquid crystal display apparatus according to this invention.
Figure 19:
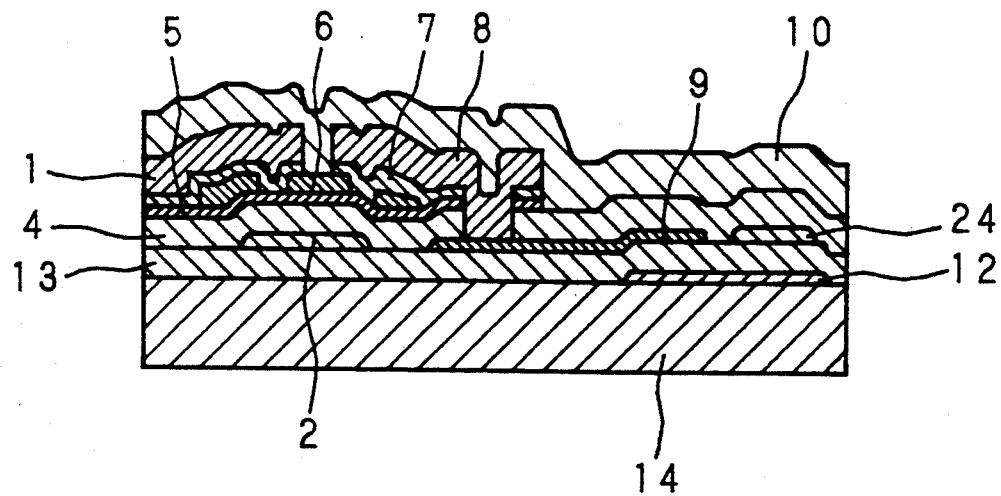
FIG. 19 is a cross sectional view taken along the line G—G' of FIG. 18.
Figure 20:
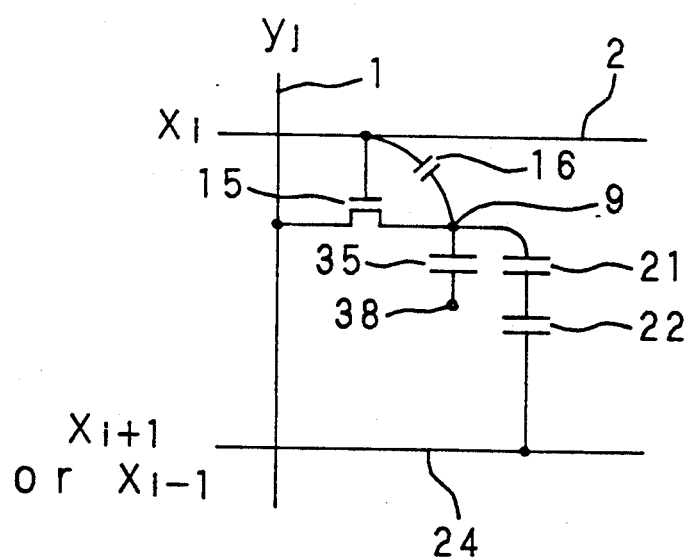
FIG. 20 is a diagram of an equivalent circuit of FIG. 18.
Figure 21:
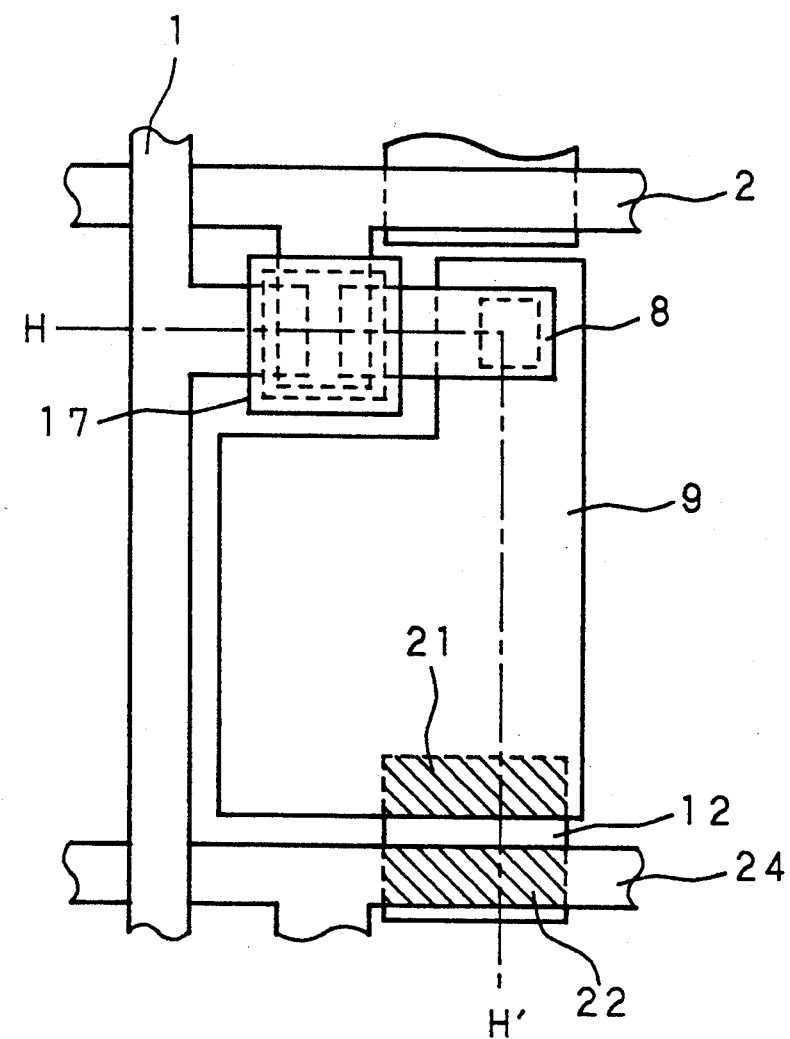
FIG. 21 is a plan view showing a modified structure of a TFT array substrate of one pixel used in the liquid crystal display apparatus according to this invention.
Figure 22:
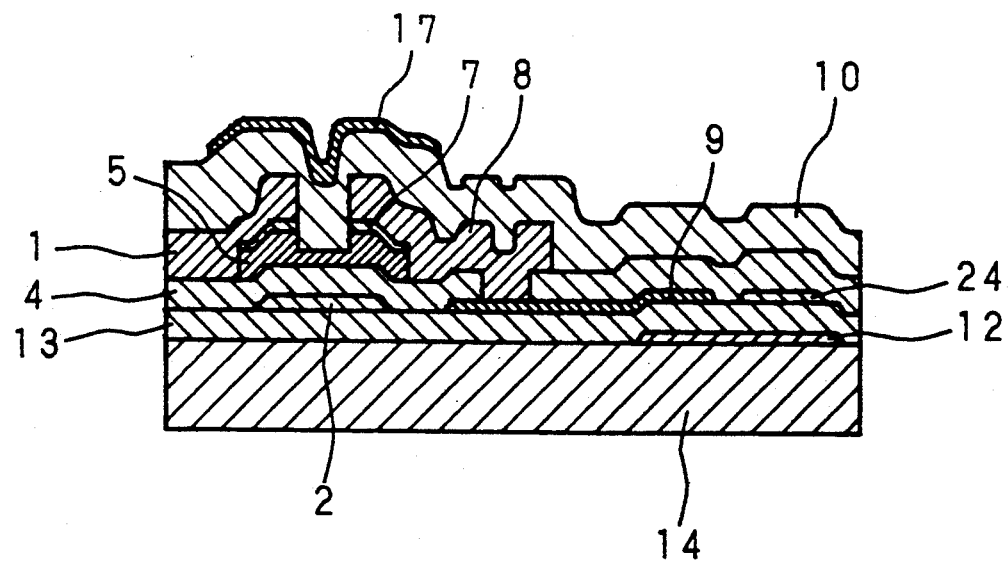
FIG. 22 is a cross sectional view taken along the line H—H' of FIG. 21.
Figure 23:
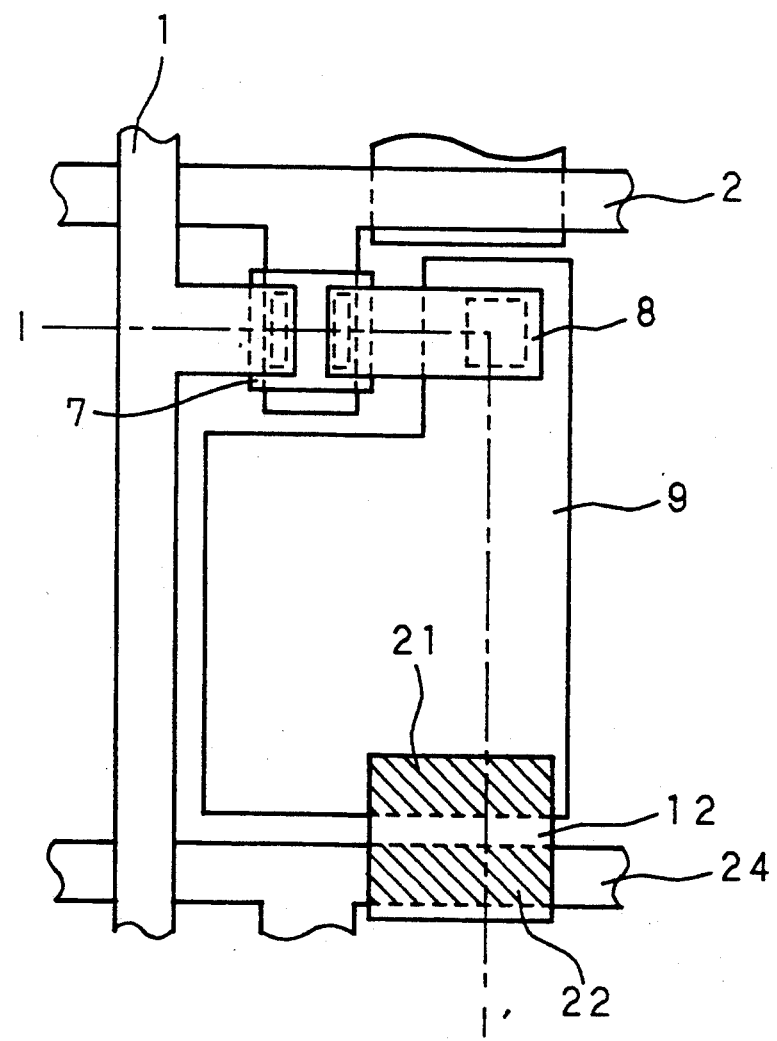
FIG. 23 is a plan view showing a modified structure of a TFT array substrate of one pixel used in the liquid crystal display apparatus according to this invention.
Figure 24:
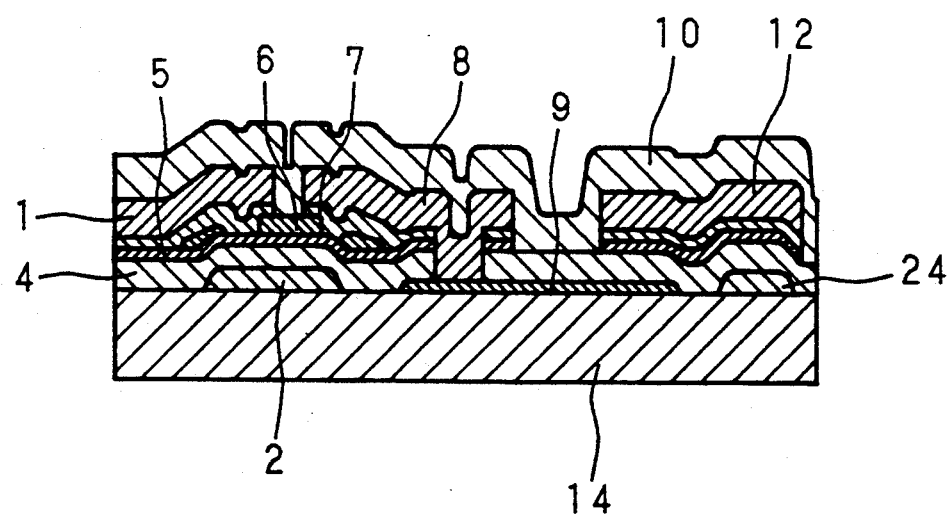
FIG. 24 is a cross sectional view taken along the line I—I' of FIG. 23.
Figure 25:
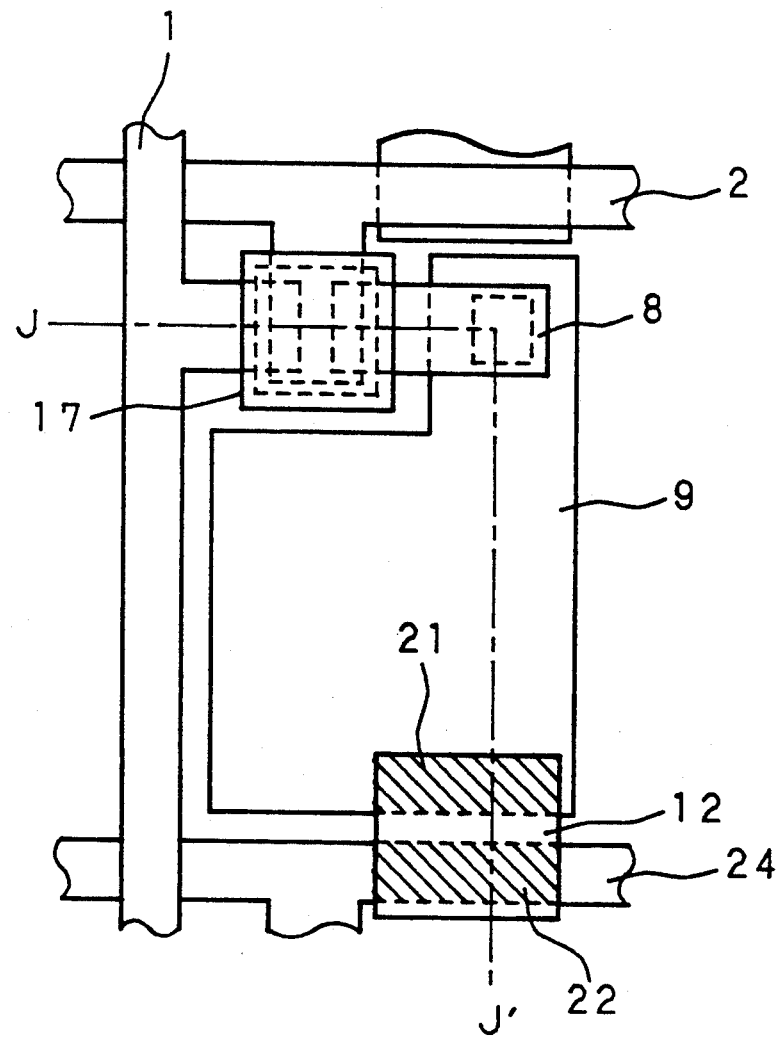
FIG. 25 is a plan view showing a modified structure of a TFT array substrate of one pixel used in the liquid crystal display apparatus according to this invention.
Figure 26:
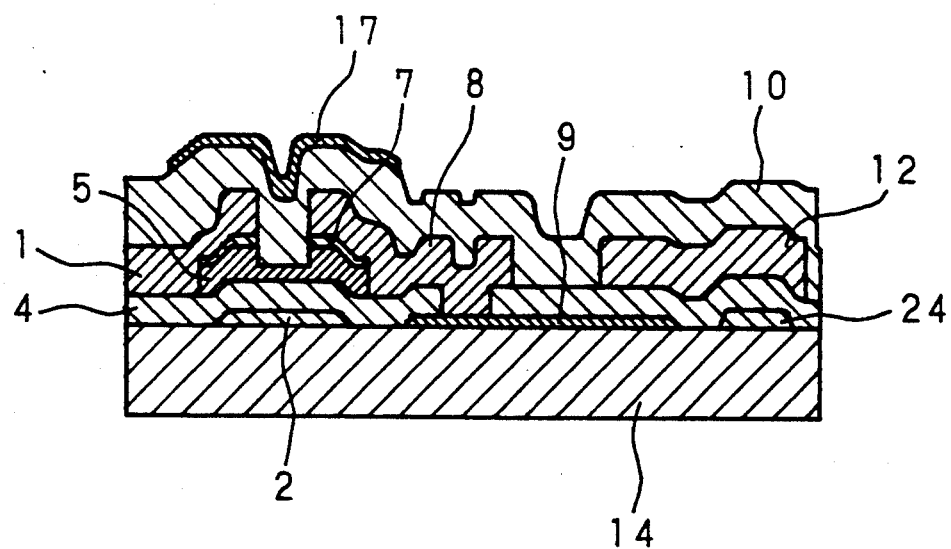
FIG. 26 is a cross sectional view taken along the line J—J' of FIG. 25.

FIG. 18 is a plan view showing a modified structure of a TFT array substrate of one pixel of the liquid crystal display apparatus, FIG. 19 being a cross section view taken along the line G—G' of FIG. 18 and FIG. 20 being a diagram of an equivalent circuit of FIG. 18. FIG. 21 is a plan view showing the construction of a modification and FIG. 22 is a cross sectional view taken along the line H—H' of FIG. 21. In the figures, the same reference numerals as in FIGS. 7 through 9 depict the same elements and what is different from the array of FIGS. 7 through 9 is a gate electrode line 24 at the succeeding row (or at the preceding row) and a shading film 17.

The TFT array substrate will be manufactured in a manner as follows.

A transparent conductive film of ITO or the like is formed on the transparent insulating substrate 14 of glass or the like through EB deposition. An unnecessary portion of the transparent conductive film is removed through photolithography and etching etc., to form the island-like floating electrode 12. The dielectric film 13 is formed of one or plural layers of silicon nitride, silicon oxide or tantalum oxide through plasm CVD, sputtering, etc.

Thereafter, a transparent conductive thin film of ITO or the like is formed through sputtering etc., and the pixel electrode 9 is formed through photolithography and etching etc. At this time, the floating electrode 12 and pixel electrode 9 are overlapped with each other across the dielectric film 13 held therebetween, so that the first storage capacitance 21 is formed.

In the next place, metal, Cr or Mo, etc., is deposited by sputtering etc. Then, the gate electrode lines 2 and 24 are formed through photolithography and etching, etc. At this time, the floating electrode 12 is overlapped with the gate electrode line 24 across the dielectric film 13 held therebetween, thereby constituting the second storage capacitance 22.

The gate insulating film 4 of silicon nitride or the like, the semiconductor (i) layer 5, e.g., amorphous silicon (i) layer and the upper insulating film 6 are sequentially deposited by plasma CVD etc. Then, the upper insulating film 6 is patterned. After the semiconductor (n+) layer 7 such as amorphous silicon (n+) layer is formed through plasma CVD etc., a contact hole between the pixel electrode 9 and drain electrode 8 is formed through patterning. A conductive thin film of Al or Mo, etc. is further deposited by sputtering etc., and the source electrode line 1 and drain electrode 8 are patterned. Then, the unnecessary portions of the semiconductor (n+) layer 7 and semiconductor (i) layer 5 are etched off through dry etching. Finally, a silicon nitride, silicon oxide film or the like is deposited by plasma CVD, and it is patterned to obtain the protecting film 10.

By sandwiching the display material such as liquid crystal 35 etc., between the TFT array substrate obtained in the foregoing manner and counter electrode substrate 38 having a transparent electrode and a color filter, etc., the liquid crystal display apparatus is manufactured.

As discussed in the foregoin embodiment, the pixel electrode 9 is arranged at such a position as not to overlap with the gate electrode 24 at the preceding or succeeding row. Moreover, the floating electrode 12 is provided extending to both the pixel electrode 9 and gate electrode 24. Therefore, the capacitive coupling is achieved between the pixel electrode 9 and gate electrode 24 by means of the series-connection of the capacitance between the floating electrode 12 and pixel electrode 9, and that between the floating electrode 12 and gate electrode 24. In consequence, the gate electrode and drain electrode are not short-circuited even when the short-circuit occurs between the floating electrode 12 and either the pixel electrode 9 or the gate electrode 24. As a result, the lowering of the production yield due to the short-circuit of a capacitance can be diminished.

It is to be noted here that the TFT array substrate may not have an upper insulating film as indicated in FIGS. 21 and 22 although the upper insulating film 6 is used in the foregoing embodiment.

The floating electrode 12 is formed first and the dielectric film 13 is applied in the foregoing embodiment. However, it may be possible as illustrated in FIGS. 23 and 24, or FIGS. 25 and 26 that the floating electrode 12 is formed by the material of the source and drain electrodes, and the first and second storage capacitances 21 and 22 may be formed between the pixel electrode 9 and the floating electrode 12, and between the floating electrode 12 and gate electrode line 24 across the gate insulating film 4. Furthermore, both types of the floating electrodes as above may be employed.

Figure 27:
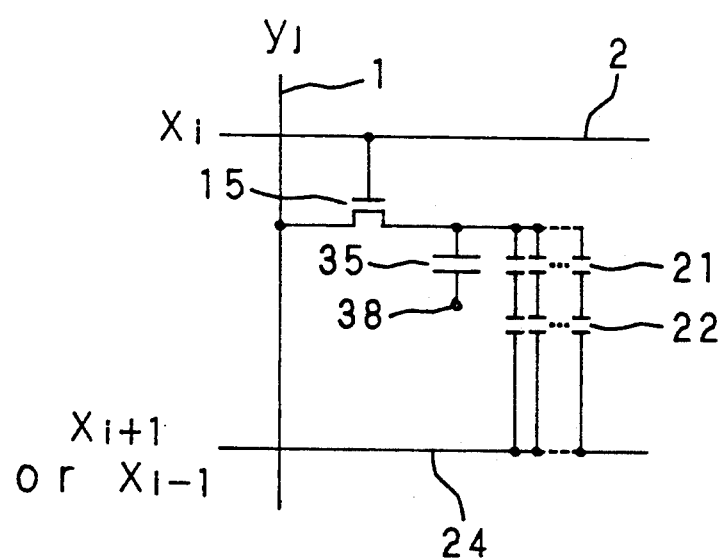
FIG. 27 is a diagram of an equivalent circuit of a liquid crystal display apparatus according to a different embodiment of this invention.
Figure 28:
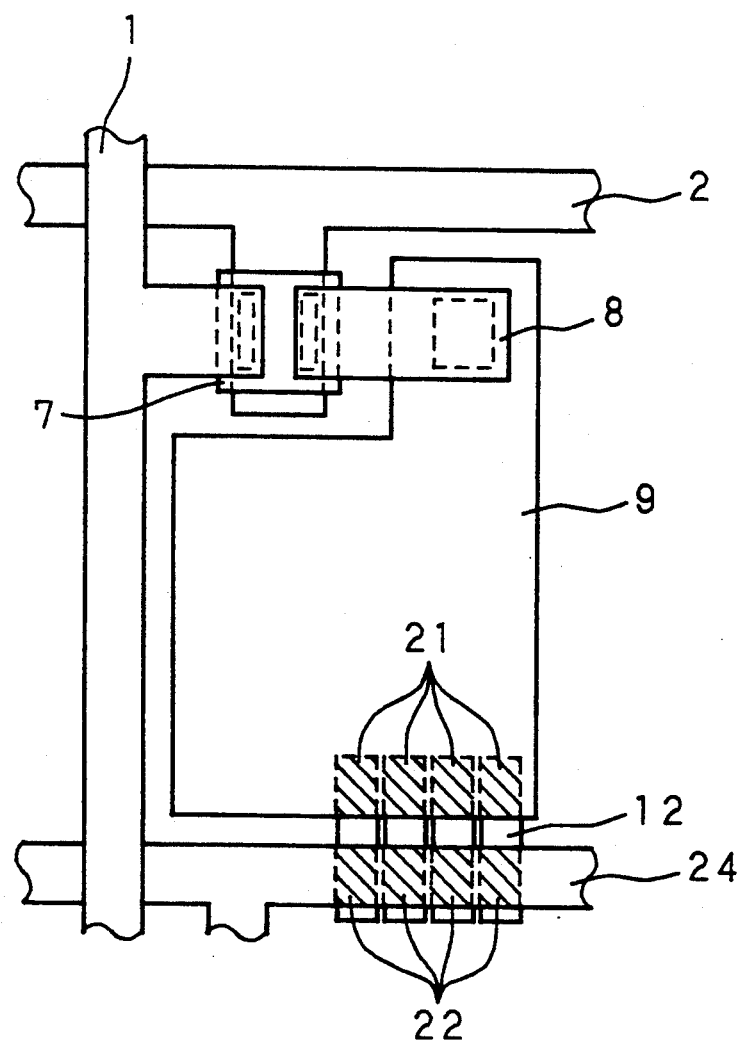
FIG. 28 is a plan view showing a modified structure of a TFT array substrate of one pixel used in the liquid crystal display apparatus according to this invention.

Besides, although one floating electrode is used in the foregoing embodiment, a plurality of floating electrodes may be possible as shown in FIG. 27. For example, four floating electrodes 12 are provided in the structure of FIG. 28.

Hereinafter, a modified embodiment of this invention will be discussed with reference to the accompanying drawings.

Figure 29:
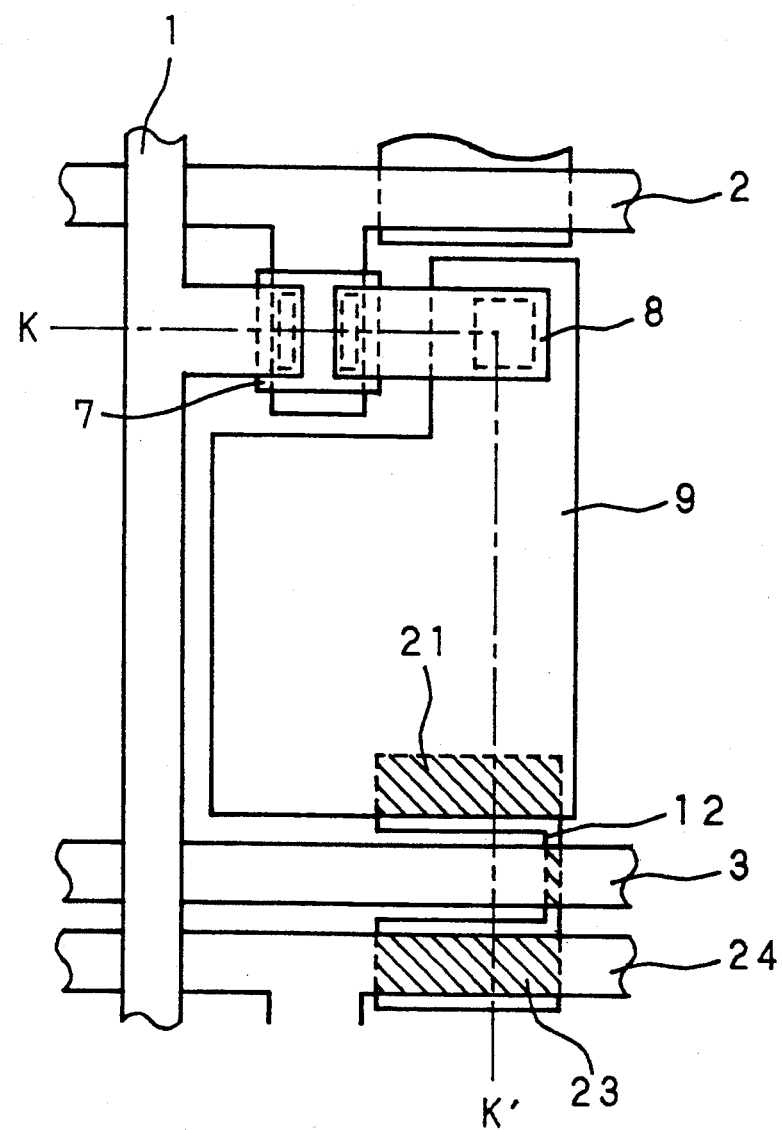
FIG. 29 is a plan view showing a modified structure of a TFT array substrate of one pixel used in the liquid crystal display apparatus according to this invention.
Figure 30:
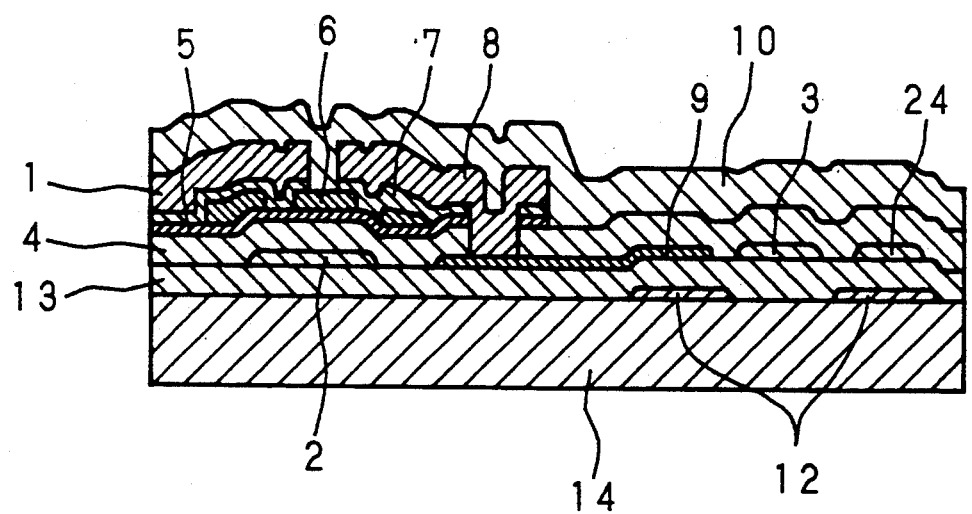
FIG. 30 is a cross sectional view taken along the line K—K' of FIG. 29.
Figure 31:
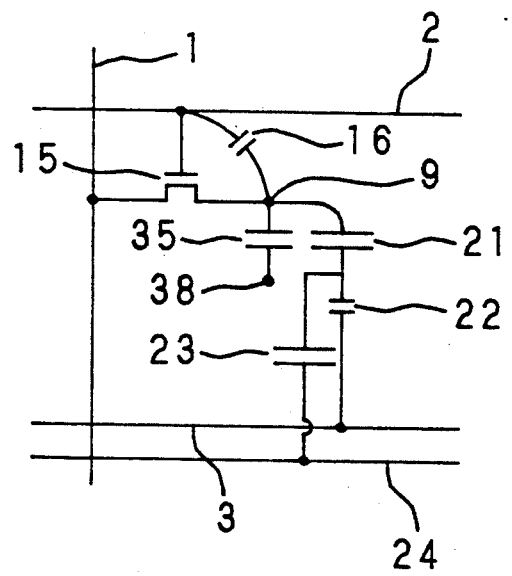
FIG. 31 is a diagram of an equivalent circuit of FIG. 29.

FIG. 29 is plan view showing the structure of a TFT array substrate of one pixel in the liquid crystal display apparatus according to a modified embodiment of this invention. FIG. 30 is a cross sectional view taken along the line K—K' of FIG. 29 and FIG. 31 is a diagram of an equivalent circuit of FIG. 29. In FIGS. 29 through 31, reference numerals 1 through 22 and 24 represent the same elements as in FIGS. 7 through 9 and FIGS. 18 through 20, the detailed description thereof being abbreviated here. Numeral 23 is a third storage capacitance.

The manufacturing method of the TFT array substrate of FIGS. 29-31 will be described below.

A transparent conductive film of ITO or the like is formed through EB deposition on a transparent insulating substrate 14 of glass or the like. An unnecessary portion of this transparent conductive film is removed through photolithography and etching etc. to form the island-like floating electrode 12. Then, the dielectric film 13 consisting of one or plural layers of silicon nitride, silicon oxide or tantalum oxide is formed through glasma CVD or sputtering, etc.

Thereafter, a transparent conductive thin film of ITO or the like is formed through sputtering, etc. The pixel electrode 9 is formed through photolithography and etching. At this time, the floating electrode 12 is overlapped with the pixel electrode 9 across the dielectric film 13 held therebetween, so that the first storage capacitance 21 is obtained.

Then, such metal, as Cr or Mo is deposited by sputtering etc., and the gate electrode line 2 and common electrode line 3 are formed through photolithography and etching, etc. At this time, the floating electrode 12 and the gate electrode 24 are overlapped with each other across the dielectric film 13 held therebetween, thus forming the third storage capacitance 23. Then, the gate insulating film 4 made of silicon nitride or the like, semiconductor (i) layer 5, e.g., amorphous silicon (i) layer and upper insulating film 6 are sequentially deposited by plasma CVD. The upper insulating film 6 is then patterned. After the amorphous silicon (n+) layer 7 is formed through plasma CVD etc., a contact hole between the pixel electrode 9 and drain electrode 10 is formed through patterning. A conductive thin film or Al, Mo or the like is deposited by sputtering. The source electrode line 1 and drain electrode 8 are patterned. Further, the unnecessary portions of the semiconductor (n+) layer 7 and semiconductor (i) layer 5 are removed through dry etching. A silicon nitride film or silicon oxide film, etc., is deposited by plasma CVD etc., and processed with patterned, thereby forming the protecting film 10.

When the display material such as the liquid crystal 35 is sandwiched between the TFT array substrate obtained in the above-described manner and the counter electrode substrate 38 equipped with a transparent electrode and a color filter, etc., the liquid crystal display apparatus of this embodiment is manufactured.

According to the present invention embodiment, the pixel electrode 9 is so formed as not to overlap with the gate electrode 24, and moreover, the floating electrode 12 is provided extending to both the pixel electrode 9 and gate electrode 12, so that the pixel electrode 9 and gate electrode 24 are capacitively coupled by means of the series-connection of the capacitance between the floating electrode 12 and pixel electrode 9, and that between the floating electrode 12 and gate electrode 24. Therefore, even when the short-circuit occurs between the floating electrode 12 and the pixel electrode 9 or between the floating electrode and gate electrode 24, the short-circuit never occurs between the gate electrode 24 and pixel electrode 9. Accordingly, the lowering in the production yield of the TFT substrate array due to the short-circuit can be reduced.

Although the floating electrode 12 in the aforementioned embodiment is a transparent conductive film, an opaque film such as a metallic film or the like may be used as the floating electrode if it is not inconvenient for display.

Moreover, although the floating electrode and common electrode are overlapped in a small area (second storage capacitance 22), the area may be larger.

Figure 32:
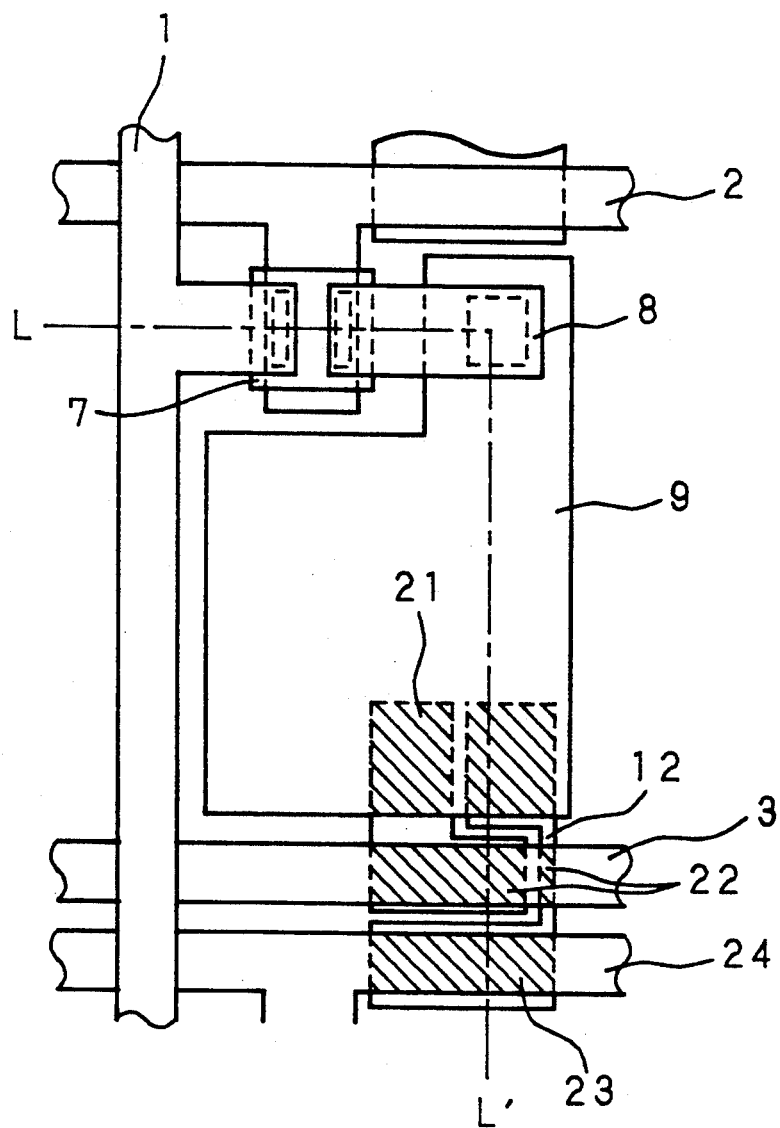
FIG. 32 is a plan view showing a modified structure of a TFT array substrate of one pixel used in the liquid crystal display apparatus according to this invention.
Figure 33:
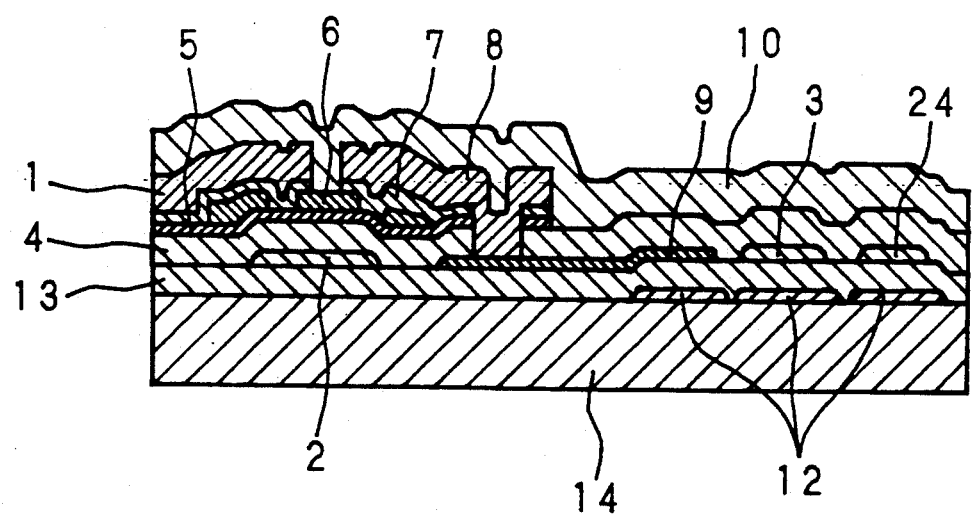
FIG. 33 is a cross sectional view taken along the line L—L' of FIG. 32.
Figure 34:
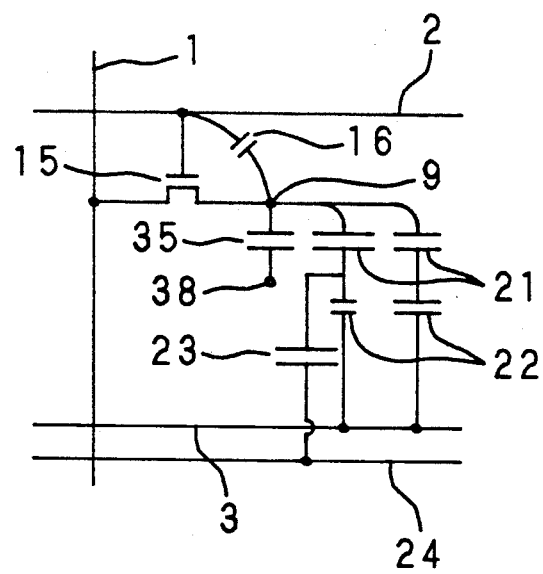
FIG. 34 is a diagram of an equivalent circuit of FIG. 32.

The storage capacitance is formed only between the floating electrode and gate electrode in the aforementioned embodiment, but, a storage capacitance between the floating electrode and common electrode may be added as understood from FIGS. 32, 33 and 34.

Figure 35:
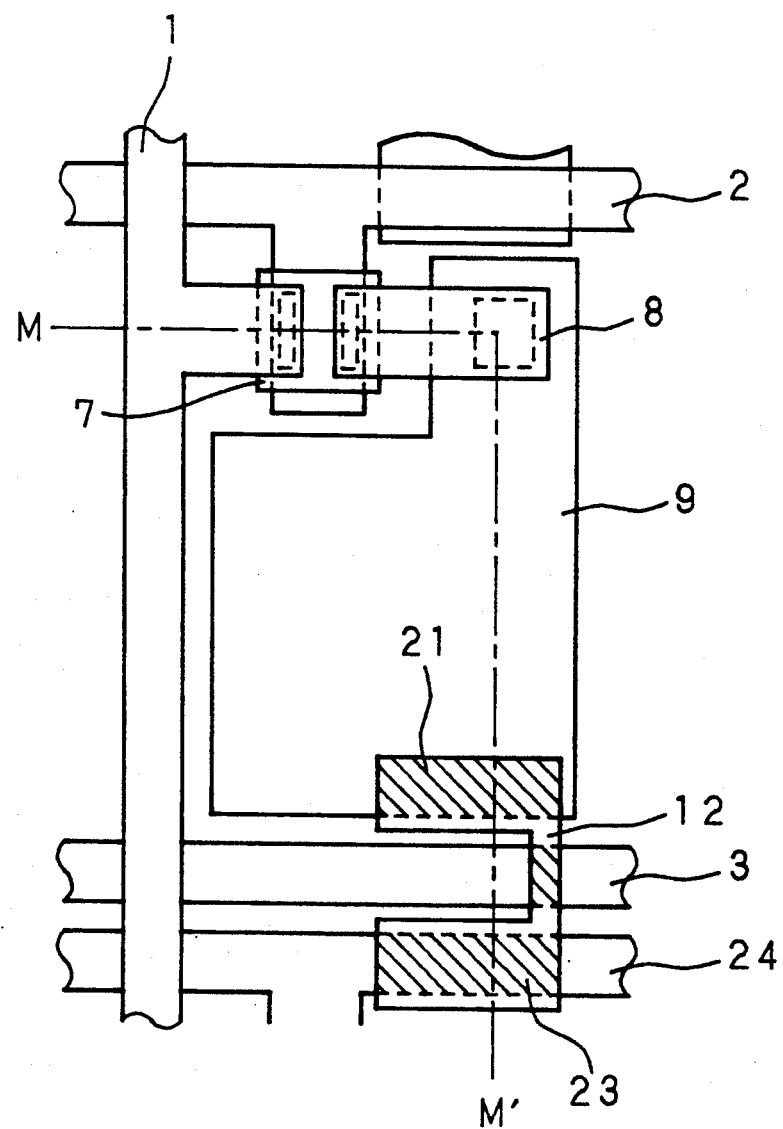
FIG. 35 is a plan view showing a modified structure of a TFT array substrate of one pixel used in the liquid crystal display apparatus according to this invention.
Figure 36:
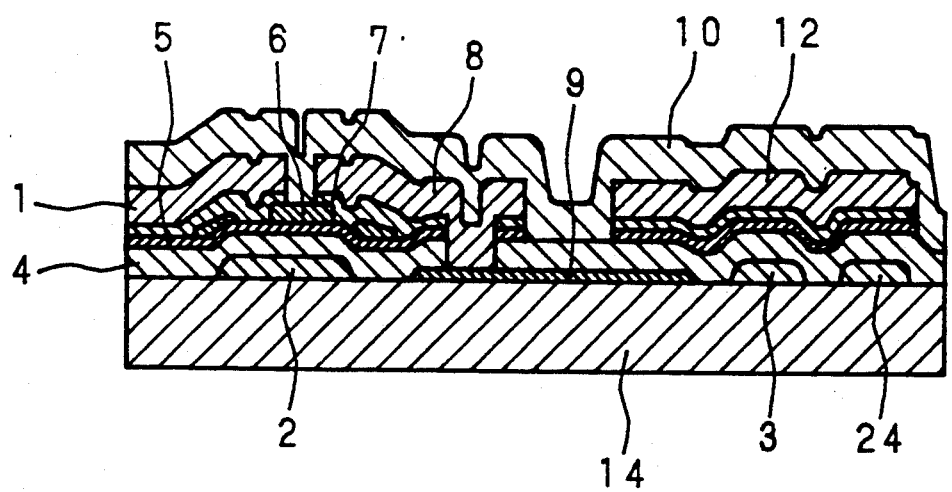
FIG. 36 is a cross sectional view taken along the line M—M' of FIG. 35.

In contrast to the above embodiment wherein the floating electrode 12 is formed first and the dielectric film 13 is applied, it may be possible that the floating electrode be formed of the material of the source and drain electrodes and the first and third storage capacitance 21 and 23 formed between pixel electrode 9 and the floating electrode 12, and between the floating electrode 12 and gate electrode line 24 across the gate insulating film 4 and as shown in FIGS. 35 and 36. Furthermore, both types of the floating electrodes as above may be employed.

Figure 37:
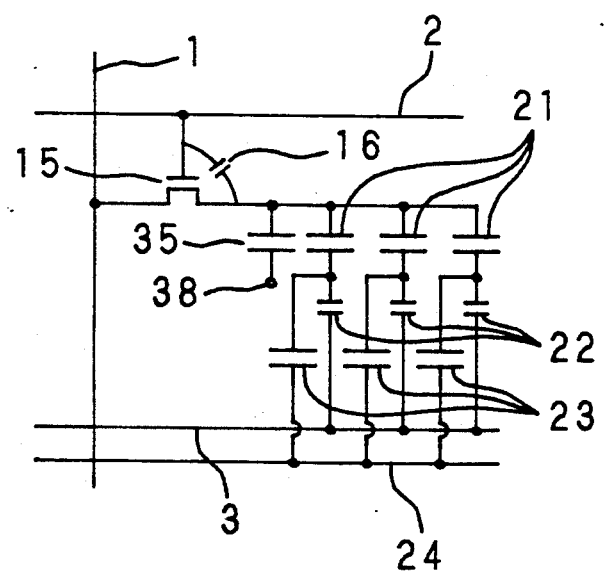
FIG. 37 is a diagram of an equivalent circuit of a liquid crystal display apparatus according to a further embodiment of this invention.
Figure 38:
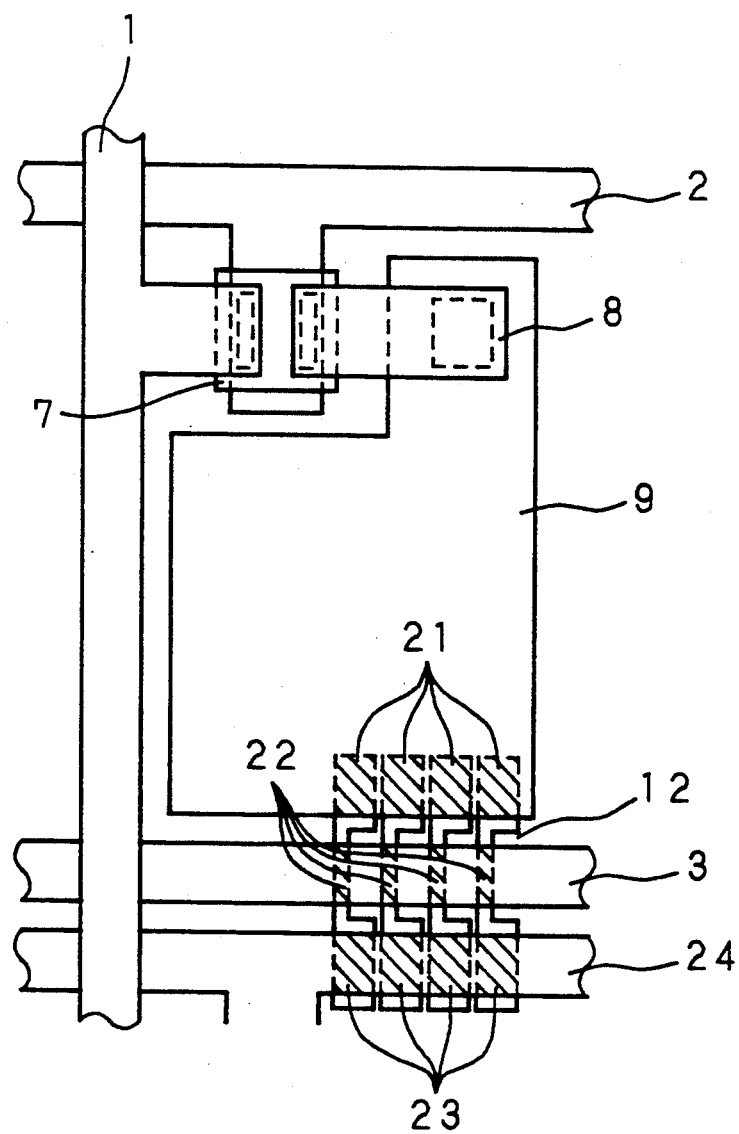
FIG. 38 is a plan view showing a modified structure of a TFT array substrate of one pixel used in the liquid crystal display apparatus according to this invention.

Although the floating electrode 12 is one in the aforementioned modified embodiment, it may be in plural number, for example, 4 as shown in FIGS. 37 and 38.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. A liquid crystal display apparatus comprising:
 a TFT (thin film transistor) array in which a plurality of common electrode lines, a plurality of gate electrode lines and a plurality of source electrode lines intersecting said common electrode lines and gate electrode lines are provided on a transparent insulating substrate, with a TFT in the vicinity of each intersection of said gate electrode line and source electrode line, having a pixel electrode corresponding to a pixel connected to a drain electrode of said TFT, said pixel electrode being arranged so as not to overlap with said common electrode line;
 counter electrodes provided confronting said TFT array;
 a liquid crystal for display sandwiched between said counter electrodes and TFT array; and
 a floating electrode arranged to overlap said pixel electrode to form a first storage capacitor and to overlap said common electrode line to form a second storage capacitor so that said pixel electrode and said common electrode line are connected by a series combination of said first storage capacitor and said second storage capacitor.

2. A liquid crystal display apparatus comprising:
 a TFT array including a plurality of common electrode lines, a plurality of gate electrode lines and a plurality of source electrode lines intersecting said common electrode lines and gate electrode lines are provided on a transparent insulating substrate, with a TFT in the vicinity of each intersection of said gate electrode lines and source electrode lines, having a pixel electrode corresponding to a pixel connected to a drain electrode of said TFT, said pixel electrode being arranged so as not to overlap with a common electrode line of said TFT;
 counter electrodes provided confronting said TFT array;
 a liquid crystal for display sandwiched between said counter electrodes and TFT array; and
 a floating electrode arranged to overlap said pixel electrode to form a first storage capacitor and to overlap a gate electrode line of an adjacent TFT to form a second storage capacitor so that said pixel electrode and said gate electrode line are connected by a series combination of said first storage capacitor and said second storage capacitor.

3. A liquid crystal display apparatus comprising:
 a TFT array in which a plurality of gate electrode lines and a plurality of source electrode lines intersecting said gate electrode lines are provided on a transparent insulating substrate, with a TFT provided in the vicinity of each intersection of said gate electrode line and source electrode line, having a pixel electrode corresponding to a pixel connected to a drain electrode of said TFT, said pixel electrode being arranged so as not to overlap with said gate electrode lines;
 counter electrodes provided confronting said TFT array;
 a liquid crystal for display sandwiched between said counter electrode and TFT array; and
 a floating electrode arranged to overlap said pixel electrode to form a first storage capacitor, to overlap said common electrode line to form a second storage capacitor, and to overlap a gate electrode line of an adjacent TFT to form a third storage capacitor.

* * * * *

UNITED STATES PATENT AND TRADEMARK OFFICE
CERTIFICATE OF CORRECTION

PATENT NO. : 5,151,806

DATED : September 29, 1992

INVENTOR(S) : Satoru KAWAMOTO et al

It is certified that error appears in the above-identified patent and that said Letters Patent is hereby corrected as shown below:

On the Title page: Inventor, item [75], delete "Noaki" and insert -- Naoki --.

Signed and Sealed this

Twenty-eighth Day of September, 1993

Attest:

BRUCE LEHMAN

Attesting Officer

Commissioner of Patents and Trademarks